(12) United States Patent
Matsubara et al.

(10) Patent No.: US 7,361,992 B2
(45) Date of Patent: Apr. 22, 2008

(54) SEMICONDUCTOR DEVICE INCLUDING INTERCONNECTS FORMED BY DAMASCENE PROCESS AND MANUFACTURING METHOD THEREOF

(75) Inventors: Naoteru Matsubara, Gifu (JP); Kazunori Fujita, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/664,875

(22) Filed: Sep. 22, 2003

(65) Prior Publication Data

US 2004/0061233 A1 Apr. 1, 2004

(30) Foreign Application Priority Data

Sep. 27, 2002 (JP) ............................ 2002-284211

(51) Int. Cl.
*H01L 29/40* (2006.01)
(52) U.S. Cl. ...................... 257/758; 257/759; 257/760; 257/700; 257/774; 257/751; 257/E21.579; 257/E21.577; 438/622

(58) Field of Classification Search ............. 257/758, 257/759, 760, 700, 211, 324, 774, 751, E21.579, 257/E21.577; 438/622
See application file for complete search history.

(56) References Cited

U.S. PATENT DOCUMENTS

| 6,218,287 | B1   | 4/2001  | Matsumoto |
|-----------|------|---------|-----------|
| 6,225,207 | B1 * | 5/2001  | Parikh ........................ 438/622 |
| 6,603,204 | B2 * | 8/2003  | Gates et al. ................ 257/760 |
| 6,764,810 | B2 * | 7/2004  | Ma et al. .................... 430/313 |
| 2002/0008323 | A1 * | 1/2002 | Watanabe et al. ........... 257/758 |

OTHER PUBLICATIONS

Chinese Office Action issued in corresponding Chinese Patent App. No. 03143451.7, dated Aug. 18, 2006.
Chinese Office Action, Date of Dispatch: Feb. 24, 2006.

* cited by examiner

*Primary Examiner*—Junghwa M. Im
(74) *Attorney, Agent, or Firm*—McDermott Will & Emery LLP

(57) ABSTRACT

After etching the interlayer dielectric film 4 formed on the lower layer interconnect line 1 into a shape with holes, the upper layer dielectric film 6 is etched into a shape with trenches utilizing the etching stopper 5. The etching stopper 5 which is exposed at the bottom of the trench is removed by additional etching, and then, the interlayer dielectric film 4 which is exposed at the bottom of the trench is etched back to a predetermined thickness. Subsequently, the hole and the trench are filled with an interconnect metal 10.

5 Claims, 5 Drawing Sheets

$K_{db}=K_{es}=7.0$
$K_{ma}=2.9$
$M_{th}=450nm$ $K_{db}=K_{es}=4.9$
$K_{ma}=2.0$
$M_{th}=450nm$

SEMICONDUCTOR DEVICE INCLUDING INTERCONNECTS FORMED BY DAMASCENE PROCESS AND MANUFACTURING METHOD THEREOF

This application is based on Japanese patent application No. 2002-284211, the content of which is incorporated hereinto by reference.

BACKGROUND OF THE INVENTION

1. Field of the Invention

The present invention relates to a semiconductor device and a manufacturing method thereof, in particular to a processing technology of an interconnect structure that includes an etching stopper formed in a dielectric film.

2. Description of the Related Art

Recently, multilayered interconnect line of semiconductor devices becomes increasingly scaled down as one of the solution to a problem such as high-speed operation, low cost manufacturing, and soon. On the other hand, interconnect delay (RC delay) problem has come to known with increasing interconnect resistance and capacitance among interconnect lines. Then, this problem becomes a major limiting factor in operation speed of devices. Consequently, some measures for solving this problem are known these days. Among those measures, using of copper as a material for interconnect lines instead of aluminum in order to reduce interconnect resistance, and using of low dielectric constant materials for dielectric films in order to reduce capacitance among interconnect lines are well known.

Since it is difficult to perform reactive ion etching on copper, the damascene process is usually employed for forming the interconnect when copper is used as the interconnect material. FIGS. 1A to 1D show an example of process of forming copper interconnects by a damascene process. There exists two types of the damascene process presently well known, one of which is a single damascene process in which an interconnect layer and a via plug are formed step-by-step, and the other of which is a dual damascene process in which an interconnect layer and a via plug are formed simultaneously (JP-A No. 2000-91425). The explanation of the latter type will be shown in the following as an example.

First, as shown in FIG. 1A, a copper diffusion barrier film 3, such as SiN deposited by plasma CVD, is formed on the lower layer interconnect line 1 including copper and the lower layer dielectric film 2. Then, an interlayer dielectric film 4 is formed on the copper diffusion barrier film 3. Although $SiO_2$ deposited by plasma CVD is often used as the dielectric film 4, a low dielectric constant material is preferable for effective reduction of interconnect delay, as mentioned above. Here, the low dielectric constant material means a material having the dielectric constant less than that of $SiO_2$, which is about 4.1 to 4.2, such as SiOC or SiOF films deposited by plasma CVD, or organic SOG (Spin on Glass), inorganic SOG or organic polymer film formed by coating method.

Next, an etching stopper 5 and an upper layer dielectric film 6 are formed on the dielectric film 4 in this order. For the etching stopper 5, a materials whose selectivity is larger than that of the upper layer dielectric film 6, such as SiN, SiC or $SiO_2$, is selected. Besides $SiO_2$, a low dielectric constant material can be also used for the upper layer dielectric film as well as the interlayer dielectric film 4.

Then, as shown in FIG. 1B, anisotropic etching is performed with the first resist pattern 7, used as a mask, which is formed with holes, and a via hole 7A is formed. After stripping the first resist pattern, anisotropic etching is performed with the second resist pattern 8, used as a mask, which is formed with trenches, and the upper layer interconnect trench 8A is formed as shown in FIG. 1C. In this process, etching stopper 5 serves to prevent the interlayer dielectric film 4 from being removed by etching.

Then, as shown in FIG. 1D, the inside walls of the via hole 7A and the upper layer interconnect trench 8A, are coated with barrier metal 9, and filled with interconnect metal 10 such as copper. The barrier metal 9 serves as a diffusion barrier against copper diffusion, and improvement of adhesiveness with the dielectric films and so on. As the barrier metal 9, a material having a high melting point, such as Ta, Ti or nitride which is deposited by PVD, is generally used. Since copper is formed on the upper layer dielectric film 6 with filling the via hole 7A and the upper layer interconnect trench 8A (no figure), CMP (Chemical Mechanical Polishing) is performed to form a via plug 7B and the upper layer interconnect line 8B.

In the interconnect formation by damascene process mentioned above, the etching stopper 5 prevents over-etching which induces the distortion of the via hole 7A, and as a result, it plays an important role for a high reliability, since the sizes of the via hole 7A and the upper layer interconnect trench 8A become uniform, regardless of the layout and the density.

However, the etching stopper mentioned above has a relatively large dielectric constant. For example, SiN which is a typical material for the etching stopper has a dielectric constant of 7. Therefore, even when a low dielectric constant material is used as a dielectric film, the reduction effect of electric capacitance among interconnect lines is inhibited by the etching stopper formed in a dielectric film. Some solutions have been developed to solve the problem of the etching stopper, such as making it thinner or changing the material of which to a lower dielectric constant material. However, they have not come to a practical use since there are many problems from the viewpoint of the productivity and the reliability.

SUMMARY OF THE INVENTION

In view of the foregoing problem, the present invention has been conceived to provide a technique of a multilayered interconnect formed by damascene process, which can effectively reduce capacitance among interconnect lines, without a significant change in the material or the structure.

The present invention provides a semiconductor device comprising a semiconductor substrate; a multilayered film including a first dielectric film, an etching stopper and a second dielectric film stacked on the semiconductor substrate in this order, the dielectric constant of the etching stopper being larger than that of the first and second dielectric films; and a metal interconnect formed in the multilayered film; wherein the upper surface of the etching stopper is located under the upper surface level of the metal interconnect, and the under surface of the etching stopper is located over the under surface level of the metal interconnect.

Here, the first dielectric film means a dielectric film disposed between two interconnect layers. The second dielectric film means a dielectric film disposed between two adjacent interconnect lines or interconnect trenches included in a single interconnect layer, or a film to which trenches are supposed to be formed.

When electric current flows in an interconnect line during semiconductor device operation, non-uniform electric field is generated in the cross section of the interconnect line, depending on the shape. Since the cross section of the interconnect line usually becomes a rectangle or generally rectangle shape, there is a tendency that the electric flux line converges at four corners of the rectangle. In the semiconductor device according to the present invention, the under surface level of the interconnect line and the etching stopper are separated. With this structure, a part of the region between adjacent interconnect lines, in which the electric flux line converges, is filled with a low dielectric constant material. Therefore, a substantial capacitance among interconnect lines can be reduced, even when a high dielectric constant material is used as the etching stopper.

The invention also provides a method of manufacturing a semiconductor device comprising the steps of forming a first dielectric film on a semiconductor substrate; forming an etching stopper that has a higher dielectric constant than the first dielectric film on the first dielectric film; forming a second dielectric film that has a lower dielectric constant than the etching stopper on the etching stopper; performing selective etching on the second dielectric film to form a trench until the etching stopper is exposed; removing the etching stopper exposed at the bottom of the trench until the first dielectric film is exposed; performing selective etching on the first dielectric film to a predetermined thickness to have the depth of the trench having a predetermined depth; and forming a metal film in the trench.

The manufacturing method may also comprise the step of performing selective etching on the etching stopper and the first dielectric film to form a via hole, after forming the second dielectric film and prior to performing selective etching on the second dielectric film to form a trench. This technique can be applied to a dual damascene process by forming the metal film in both of the via hole and the trench simultaneously. Here, the via hole means a hole in which a via plug is formed that connects interconnect lines, such as those formed in the interconnect layer below the first dielectric film and in the layer which includes the second dielectric film.

The dielectric constant of the etching stopper may be larger than or equal to a summation of 2 and the dielectric constant of either one of the dielectric constants of the first and second dielectric films. It means that the dielectric constant of the etching stopper may be more than or equal to 2 larger than at least either one of the dielectric constants of the first and second dielectric films. For more effective reduction of capacitance among interconnect lines, it is preferable that the dielectric constant of the etching stopper is more than 2 larger than both of the dielectric constants of the first and second dielectric films.

For the first and second dielectric films, a material which includes Si, O, C and H as the constituting element, such as SiOC deposited by plasma CVD and MSQ (methyl silsesquioxane) deposited by coating method, may be used. To mention a typical example, the dielectric constants of SiN, formed as the etching stopper, and SiOC, formed as the first and second dielectric films, are respectively 7 and 2.9. Therefore, when the manufacturing method mentioned above is applied to a production process of a semiconductor device which is constituted by such materials, the reduction of the capacitance among the interconnect lines can be effectively achieved by separating the etching stopper from the bottom of the interconnect line.

In addition, this method enables the material which is constituted by a low resistance metal such as copper, to be used as the interconnect line by the damascene process. As a result, the interconnect delay can be effectively suppressed by the combination with the separation of the etching stopper from the under surface level of the interconnect line.

DETAILED DESCRIPTION OF THE INVENTION

Referring to the accompanying drawings, preferable embodiments of the present invention will be described as follows.

FIGS. 2A to 2F show the method of manufacturing a semiconductor device according to the embodiment of the present invention.

Figure 2A:
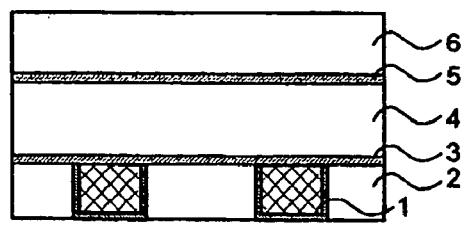
FIGS. 2A to 2F are schematic cross-sectional views showing method of manufacturing a semiconductor device according to the present invention.

Firstly, there is formed a lower layer interconnect line 1 in a lower layer dielectric film 2. Then, a metal diffusion barrier 3, an interlayer dielectric film 4, an etching stopper 5, and an upper layer dielectric film 6 are deposited in this order on the lower layer dielectric film 2 (FIG. 2A).

The lower layer interconnect line 1 may be formed with metal including copper. The diffusion barrier 3 may be formed with a film made of a low dielectric constant material such as SiN and SiC deposited by plasma CVD with a thickness of 50 nm. When SiN is used, the deposition is performed at 300 to 600 degree centigrade with a mixed gas such as monosilane/ammonia and dichlorosilane/ammonia. When SiC is used, the deposition is performed at 300 to 600 degree centigrade with a mixed gas such as trimethyl silane and ammonia. The diffusion barrier 3 may have a multilayered structure including such as $SiO_2$/SiN, SiC/SiN and $SiO_2$/SiCN for example.

The interlayer dielectric film 4 is formed with a film made of low dielectric constant material such as SiOC deposited by plasma CVD with a thickness of 470 nm. The deposition is performed at 300 to 600 degree centigrade using a mixed gas such as trimethyl silane and oxygen. Instead of using SiOC, low dielectric constant materials other than SiOC such as organic SOG may be used. In this case, for example, MSQ is coated and subsequently annealed at about 400 degree centigrade. In addition, inorganic SOG, organic polymer or porous may be also used as the interlayer dielectric film 4. Furthermore, a material such as $SiO_2$ deposited by plasma CVD may be used as the interlayer dielectric film 4 as well.

The etching stopper 5 is formed with a film made of dielectric material such as SiN, SiC and $SiO_2$ with a thickness of 50 nm. When $SiO_2$ is used, the deposition may be performed by plasma CVD at 300 to 600 degree centigrade with a mixed gas such as monosilane/dinitrogen monoxide, monosilane/oxygen, and TEOS (Tetra Ethyl Ortho Silicate)/oxygen. When SiN or SiC is used, the deposition may be performed under the same condition as that of the deposition of the diffusion barrier 3.

The upper layer dielectric film 6 is formed with a film such as SiOC deposited by plasma CVD with a thickness of 300 nm. Instead of using SiOC, a low dielectric material other than SiOC may be used, as described above in the case of the interlayer dielectric film 4. It is preferable to improve the surface of the upper layer dielectric film 6 by plasma exposure in a gas such as He, or by UV treatment in order to improve the size controllability at a process of resist patterning which will be explained hereinafter. On the other hand, since the resist pattern is not formed on the interlayer dielectric film 4, it is preferable to have the surface of the interlayer dielectric film 4 untreated in order to avoid increasing the dielectric constant of the dielectric film by the surface improvement.

Next, the first resist pattern 7 formed with hole patterns is formed by photo resist coating on the upper layer dielectric film 6 and subsequent exposure. Then, there is formed a via hole 7A which is opened to the diffusion barrier 3 through the upper layer dielectric film 6, the etching stopper 5 and the interlayer dielectric film 4 by anisotropic etching (FIG. 2B). A mixed gas such as $C_4F_8/Ar/N_2$ and $CH_2F_2/CF_4/Ar/N_2$ is used for etching. After that, the first resist pattern 7 is stripped by an oxygen plasma.

Then the second resist pattern 8 formed with trench patterns is formed by photo resist coating on the upper layer dielectric film 6 and subsequent exposure. Then, there is formed an upper layer interconnect trench 8A in the upper layer dielectric film 6 by anisotropic etching (FIG. 2C). In this process, the etching stopper 5 prevents the interlayer dielectric film 4 from being etched. The etching gas used here may be the same as that used for forming the via hole 7A such as $C_4F_8/Ar/N_2$ and $CH_2F_2/CF_4/Ar/N_2$. At this time, residues of the first resist pattern 7 and the second resist pattern 8 remain at the bottom of the via hole 7A, which is expressed as a photo resist 11. Before the photo resist coating, an antireflective film may be formed to be placed under the resist pattern.

Figure 2D:
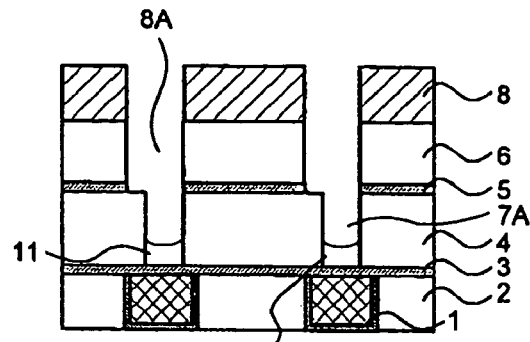
Figure 2B:
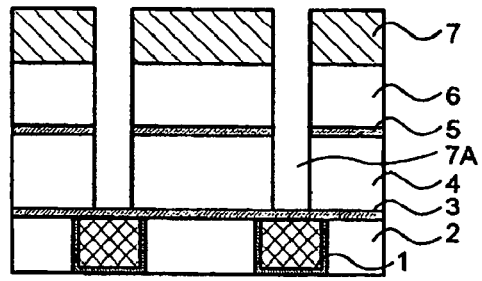

Next, the etching stopper 5 which is exposed at the bottom of the upper layer interconnect trench 8A is removed by additional anisotropic etching (FIG. 2D). A mixed gas such as $CH_2F_2/CO$ and the like may be used as the etching gas in this process. This etching process may be performed continuously with the etching process to form the interconnect trench 8A by changing the source gas. In other cases, this etching process may be performed separately after carrying out to the air after the interconnect trench 8A is formed. After that, the second resist pattern 8 and the photo resist 11 remaining at the bottom of the via hole 7A are stripped by an oxygen plasma.

Figure 2E:
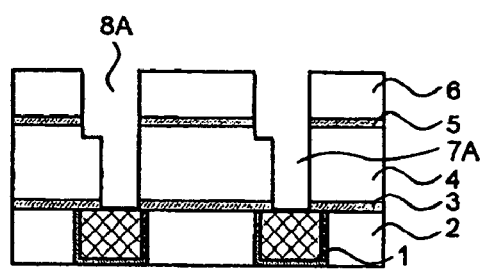
Figure 2C:
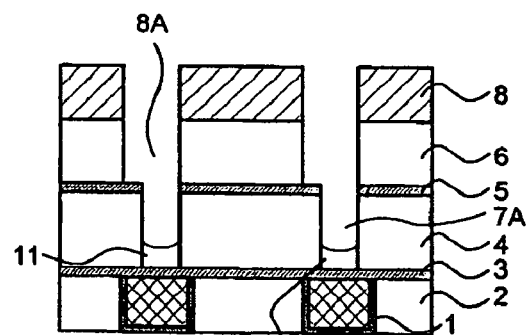

Next, the upper layer dielectric film 6, the interlayer dielectric film 4 which is exposed at the bottom of the upper layer interconnect trench 8A, and the diffusion barrier 3 which is exposed at the bottom of the via hole 7A are etched back (FIG. 2E). In this process, for instance, the upper layer dielectric film 6 and the interlayer dielectric film 4 are etched back about 70 nm, and the diffusion barrier 3 is etched back about 50 nm, with a mixed gas such as $CH_2F_2/CO$ at a pressure of 0.7 Pa and a power of 1300 W of microwave (400 W of RF). In this technique, the etching selectivity of the upper layer dielectric film 6 and the interlayer dielectric film 4 to the diffusion barrier 3 can be controlled by changing the etching condition. As a result, each film can be etched back to a predetermined or desired depth.

As shown in FIG. 2E, the under surface level of the upper layer interconnect trench 8A is located below the interface between the etching stopper 5 and the interlayer dielectric film 4.

Then, a barrier metal 9 is formed to cover the side wall and the bottom surface inside of the opening, i.e., the via hole 7A and the upper layer interconnect trench 8A shaped as a dual damascene structure as mentioned above. The barrier metal 9 may be formed with a film such as Ti, Ta, TiN, TaN, TiW, TaW and WN with a thickness of 50 nm deposited by sputtering or CVD. Some of those materials may be stacked to constitute a multilayered structure. After that, an interconnect metal 10 is deposited in the opening to fill therein. The interconnect metal 10 may include cupper. In addition, a material with a low resistance, such as Ag or AgCu other than copper, may be used as the interconnect metal 10, and the deposition may be performed by sputtering, CVD, plating, or the combination.

Figure 2F:
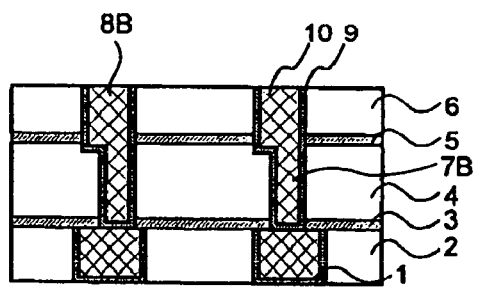

Then, the barrier metal 9 and the interconnect metal 10 stacked on the upper layer dielectric film, not shown in the drawings, is removed by performing CMP (Chemical mechanical polishing) to form a via plug 7B and an upper layer interconnect line 8B (FIG. 2F). Before filling the opening with the barrier metal 9 and the interconnect metal 10, a cap film made of a material such as SiN, SiC and $SiO_2$ may be formed on the upper layer dielectric film 6 to prevent the defect generation in the upper layer dielectric film 6 induced by CMP.

In this embodiment, the semiconductor device can have a interconnect configuration in which the under surface level of the upper layer interconnect line 8B is located below the interface between the etching stopper 5 and the interlayer dielectric film 4. This is due to the process during the dual damascene process shown in FIG. 2E in which the interlayer dielectric film 4 is etched back. Additionally, the distance between the under surface level of the upper layer interconnect line 8B and the interface between the etching stopper 5 and the interlayer dielectric film 4 can be controlled by optimizing the etching-back condition.

Although FIGS. 2A to 2F show an embodiment in a dual damascene process, the present invention is also applicable effectively to a single damascene process in the same manner. Additionally, it is possible to produce the interconnect structure which has more than two interconnect layers stacked by sequentially repeating the processes mentioned above.

EXAMPLE

Figure 3:
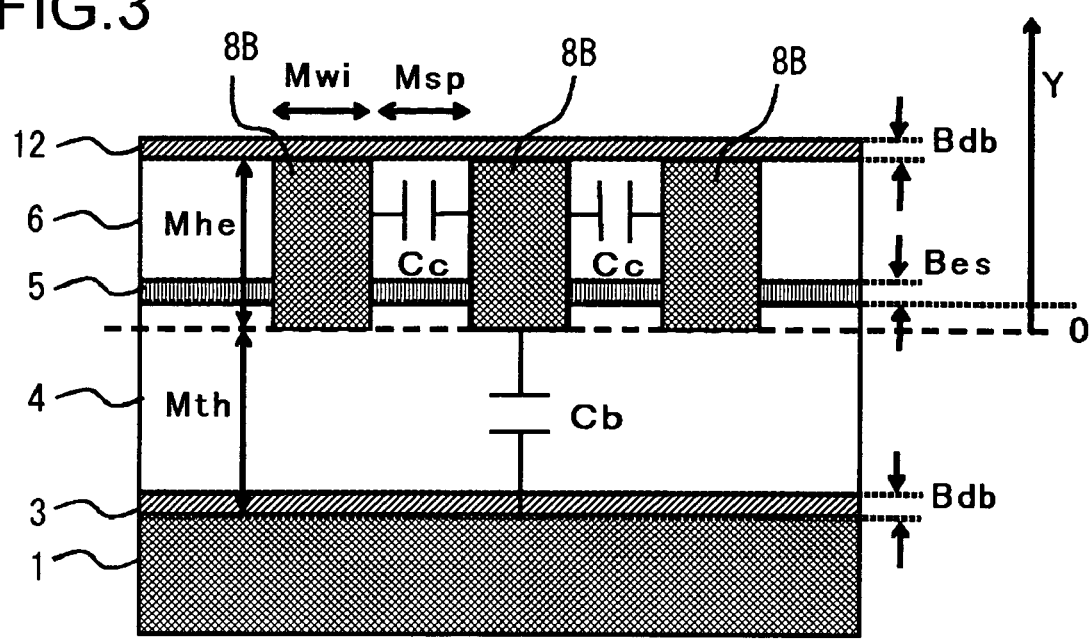
FIG. 3 is a schematic cross-sectional view of an interconnect structure used for the evaluation of the reduction effect of the interconnect capacitance in the embodiment.

The influence of the location of the etching stopper on capacitance among interconnect lines is evaluated by using the interconnect structure shown in FIG. 3. The sizes of the width "Mwi" of the upper layer interconnect line 8B, the distance "Msp" between the interconnect lines, the height "Mhe" of the interconnect line, the thickness "Bdb" of the diffusion barriers 3 and 12, and the thickness "Bes" of the etching stopper 5 are fixed and defined as follows.

| Parameter | | Size (nm) |
|---|---|---|
| Width of Interconnect line | Mwi | 200 |
| Distance between interconnect lines | Msp | 200 |
| Height of Interconnect line | Mhe | 350 |

-continued

| Parameter | | Size (nm) |
|---|---|---|
| Thickness of diffusion barrier | Bdb | 50 |
| Thickness of etching stopper | Bes | 50 |

The variable values described in the following figures, Kdb, Kes, Kma, and Mth are, respectively, the dielectric constant of the lower and upper layer diffusion barriers 3 and 12, the dielectric constant of the etching stopper 5, the dielectric constant of the interlayer and upper layer dielectric films 4 and 6, and the distance between the upper surface level of the lower layer interconnect line 1 and the under surface level of the upper layer interconnect line 8B. A variable value Y indicates the location of the interface between the etching stopper 5 and the interlayer dielectric film 4 (hereinafter simply referred to as "the interface"), and Y=0 indicates the under surface level of the upper layer interconnect line 8B. In this case, since the height "Mhe" of the upper layer interconnect line 8B is fixed, the value Y only depends on the location of the etching stopper.

Figure 4A:
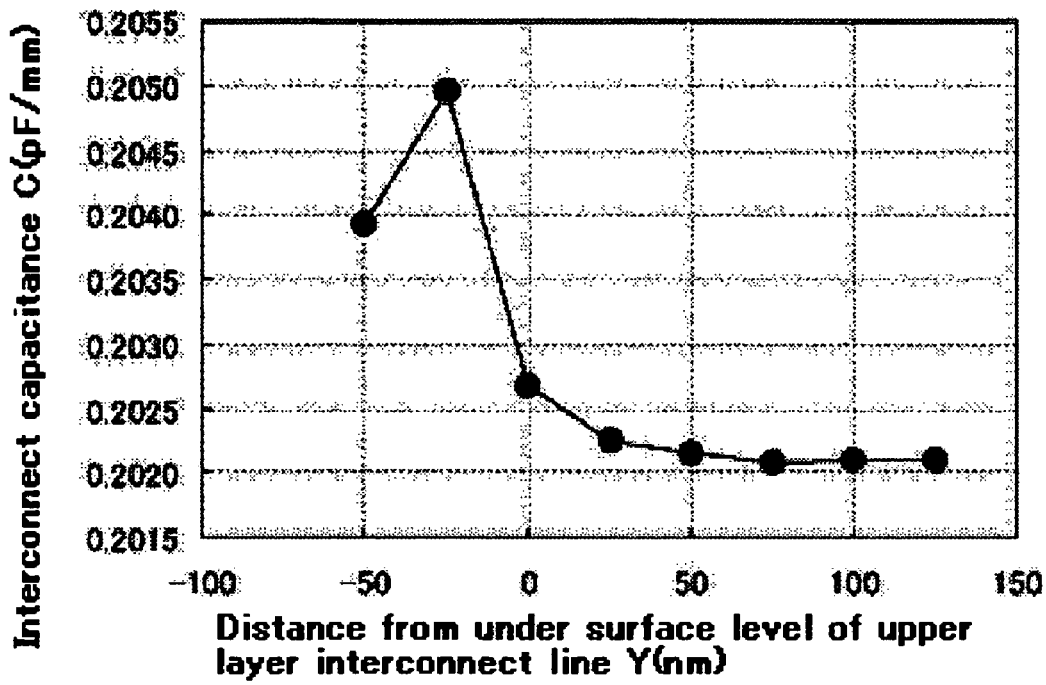
FIGS. 4A and 4B are line plots showing a dependence of an interconnect capacitance on the distance between the under surface level of the upper layer interconnect line and the interface.
Figure 4B:
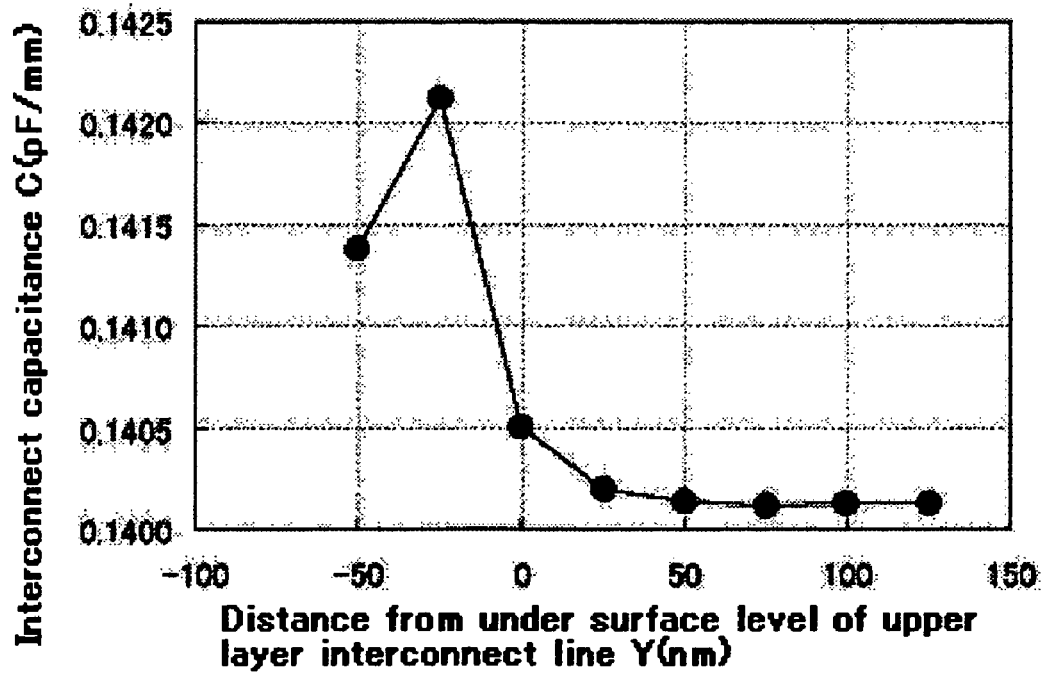

FIGS. 4A and 4B show the dependences of the capacitance among the interconnect lines (hereinafter simply referred to as "interconnect capacitance") on the value Y, i.e., the distance between the under surface level of the upper layer interconnect line 8B and the interface. Here the interconnect capacitance C indicates the total electric capacitance between an interconnect line 8B placed in the middle of the three interconnect lines 8B and the rest of the interconnect lines. Here, the capacitances between the interconnect line 8B placed in the middle and the two adjacent interconnect lines 8b placed both sides is denoted by Cc. The capacitances between the interconnect line 8B placed in the middle and the lower layer interconnect line is denoted by Cb. The relation between C, Cc and Cb is represented as follows.

$$C=2Cc+Cb$$

FIG. 4A shows the result when SiN is used as the etching stopper 5 and SiOC is used as the interlayer and upper layer dielectric films 4 and 6. In this case, the dielectric constants Kes and Kma are respectively 7 and 2.9. This figure indicates that the interconnect capacitance decreases when the position of the interface moves upward, i.e., when the distance between the interface and the under surface level of the upper layer interconnect line increases. It is shown that the distance appropriate for the significant reduction effect is more than or equal to 50 nm.

FIG. 4B shows the result when SiC is used as the etching stopper 5 and porous MSQ is used as the interlayer and upper layer dielectric films 4 and 6. In this case, the dielectric constants Kes and Kma are respectively 4.9 and 2. This figure indicates that the interconnect capacitance can be effectively reduced in this case as well, when the distance between the interface and the under surface level of the upper layer interconnect line is more than or equal to 50 nm.

Figure 1A:
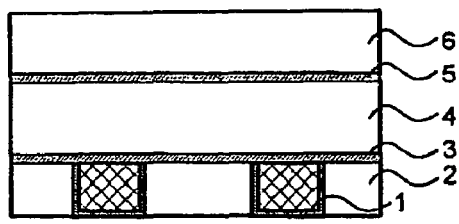
FIGS. 1A to 1D are schematic cross-sectional views showing a conventional method of manufacturing a semiconductor device.
Figure 1D:
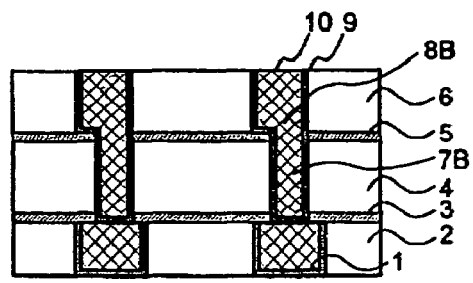
Figure 1B:
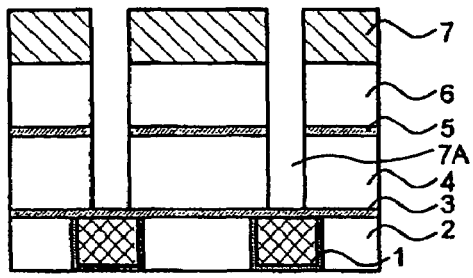
Figure 1C:
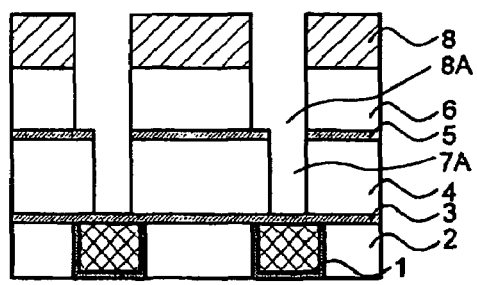

In both of FIGS. 4A and 4B, the capacitance has maximum value when the value Y is −25 nm, i.e., the interface is located 25 nm below the under surface level of the upper layer interconnect line. At this location, the middle surface of the etching stopper is identical to the under surface level of the upper layer interconnect line, since the etching stopper in this example has a thickness of 50 nm. Therefore, the capacitance among the interconnect lines is affected most significantly by the convergence of the electric flux line at the both corners of the bottom of the upper layer interconnect line. It is thus understandable that the significant increase of interconnect capacitance is induced when the etching stopper 5 is happened to be etched about half of its thickness, in the case of FIG. 1C described as an conventional example. To suppress the electric capacitance among interconnect lines stably, a certain and appropriate spacing between the interface and an under surface level of the upper layer interconnect line is of importance, as described in the embodiment of the present invention. On the other hand, considering the original function of the etching stopper, that is, to keep a high dimensional precision of a interconnect trench and a via hole under the trench in the step of forming the trench, the middle surface of the etching stopper 5 is preferable to be below the middle level in the height of the upper layer interconnect line 8B.

Figure 5A:
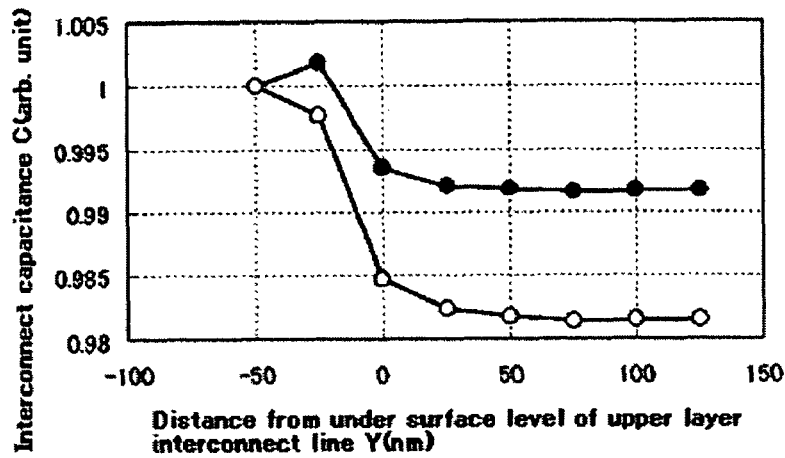
FIGS. 5A to 5C are line plots showing a comparison of the reduction effect of the interconnect capacitance in the embodiment.
Figure 5B:
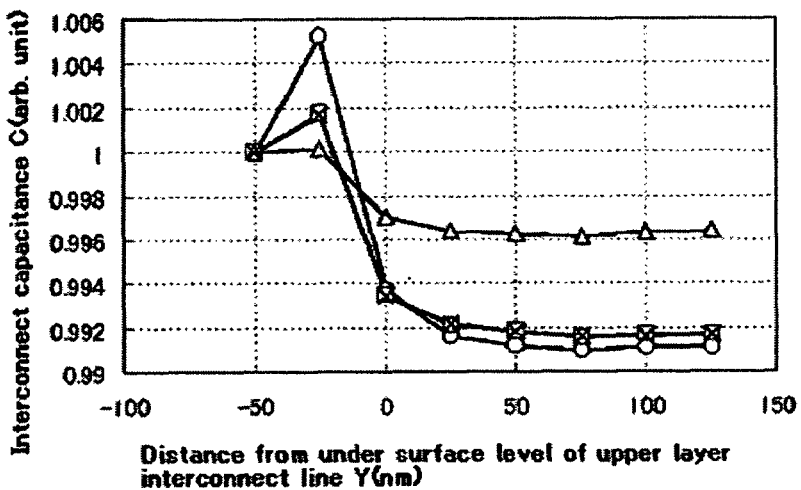
Figure 5C:
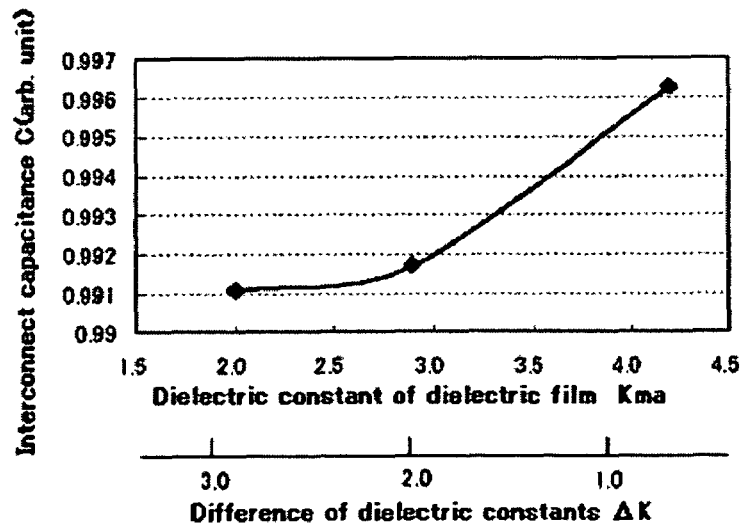

FIGS. 5A to 5C show the interconnect capacitance C normalized to compare the degree of effectiveness of this embodiment, and the value of 1 denotes the capacitance at Y=−50 nm. In this case, the valuable Y becomes −50 nm when the upper surface of the etching stopper 5 is identical to the under surface level of the upper layer interconnect line 8B, since the etching stopper 5 has a thickness Bes of 50 nm.

FIG. 5A shows the comparison when the thickness of the interlayer dielectric film is changed. Practically, the thickness of the interlayer dielectric film 4, i.e., the distance between the upper surface of the diffusion barrier 3 of the lower layer interconnect and the under surface of the etching stopper 5, changes with increasing the value Y as a result of the change of the interface location. However, in order to simplify the comparison, the distances "Mth" between the upper surface of the lower layer interconnect line 1 and the under surface level of the upper layer interconnect line 8B is fixed as 450 nm and 250 nm. The dielectric constants "Kes" and "Kma" of the etching stopper 5 and the interlayer and upper layer dielectric films 4 and 6 are fixed respectively as 4.9 and 2.9. These results indicates that the effect of the interconnect capacitance reduction can be obtained significantly in the case when the distances "Mth" is fixed as 250 nm. Therefore, it can be said that this embodiment acts effectively even when an interlayer dielectric film is required to be formed thinner in accordance with the size of the device including the interlayer dielectric film when it is scaled down.

Generally, the following relation is preferable to suppress interconnect delay when a via plug exists under the upper layer interconnect, since interconnect delay is in proportion to the product of interconnect capacitance and resistance.

(Height of an upper layer interconnect line)<(Height of a via plug)  (1)

On the other hand, a semiconductor device provided in this embodiment has the following relations.

(Thickness of an upper layer dielectric film)<(Height of the upper layer interconnect line)  (2)

(Height of a via plug)<(Thickness of an interlayer dielectric film)  (3)

Therefore, for more reduction of interconnect capacitance with applying this embodiment under the condition satisfying the relation (1), the following required relation is derived between the thickness of an upper layer and interlayer dielectric films.

(Thickness of an upper layer dielectric film)<(Thickness of the interlayer dielectric film)  (4)

However, the electric capacitance can be reduced effectively by this embodiment, even when the relation (1) can not be satisfied due to a constraint of the process or the like, as mentioned above.

FIG. 5B shows the result when the dielectric constant of each film is changed. Here, the comparison is performed on the interlayer and upper layer dielectric films 4 and 6 formed with $SiO_2$, SiOC and porous MSQ, the dielectric constants of which are respectively 4.2, 2.9 and 2 and the etching stopper 5 formed with SiC and SiN, the dielectric constants of which are respectively 4.9 and 7. The distance "Mth" between the upper surface of the lower layer interconnect line 1 and the under surface level of the upper layer interconnect line 8B is 450 nm. As the case when the dielectric constant "Kes" of the etching stopper 5 is fixed as 4.9, the interconnect capacitance can be more effectively reduced when the dielectric constant "Kma" of the interlayer and upper layer dielectric films 4 and 6 is 2.9 or 2, compared with the case when the dielectric constant "Kma" of the interlayer and upper layer dielectric films 4 and 6 is 4.2. Further, as the case when the dielectric constant "Kma" of the interlayer and upper layer dielectric films 4 and 6 is fixed as 4.2, the interconnect capacitance can be more effectively reduced when the dielectric constant "Kes" of the etching stopper 5 is 7, compared with the case when the dielectric constant "Kes" of the etching stopper 5 is 4.9. From these results, it can be said that the effect of the interconnect capacitance reduction by this embodiment can be obtained significantly when there is a large difference between the dielectric constants of the etching stopper Kes, and the interlayer and upper layer dielectric films Kma.

However, when a dielectric constant of an etching stopper is too large, small dimensional distortion of a distance between the interface and the under surface level of the upper layer interconnect line induces a large variation of an interconnect capacitance easily, and as a result, there becomes a high possibility of the interconnect capacitance dependence on the pattern with reflecting a variation of dimensional precision. From this viewpoint, it is preferable that a dielectric constant of the etching stopper is less than or equal to 5.

FIG. 5C shows the interconnect capacitance C normalized in FIG. 5B is expressed as a function of the dielectric constant "Kma" of the interlayer and upper layer dielectric films 4 and 6, in the case when the etching stopper 5 has a dielectric constant "Kes" of 4.9. By estimating the region in which the effect of this embodiment is obtained sufficiently, in other words, the region in which the interconnect capacitance C is well saturated in FIG. 5B, the data at Y=100 nm are plotted in FIG. 5C. In this figure, the difference between Kes and Kma is also indicated as Δ (delta) K on a horizontal axis. This figure shows that the interconnect capacitance can be reduced efficiently when the difference between the dielectric constants Kma and Kes is more than 2. For example, when SiC, the dielectric constant of which is 4.9, is used as the etching stopper, it becomes more effective by using SiOC or MSQ as the dielectric film, the dielectric constant of which is less than 2.9.

What is claimed is:

1. A semiconductor device comprising:
    a semiconductor substrate;
    a multilayered film including a first dielectric film, an etching stopper and a second dielectric film stacked on said semiconductor substrate in this order;
    a first metal interconnect embedded in the multilayered film;
    a first via plug connected to the under surface of the first metal interconnect;
    a second metal interconnect embedded in the multilayered film; and
    a second via plug connected to the under surface of the second metal interconnect, wherein
    the dielectric constant of said etching stopper is larger than that of said first and second dielectric films,
    the upper surface of said etching stopper is located under the upper surface level of said first and second metal interconnects,
    the under surface of said etching stopper is located over the under surface level of said first and second metal interconnects,
    the etching stopper is positioned substantially below the middle level in the height of said first and second metal interconnects,
    the under surface of said first and second metal interconnects is located inside the first dielectric film,
    the distance between the first metal interconnect and the second metal interconnect is smaller than the distance between the first via plug and the second via plug, and
    the etching stopper is located between the first metal interconnect and the second metal interconnect.

2. The semiconductor device as set forth in claim 1, wherein the dielectric constant of said etching stopper is less than or equal to 5.

3. The semiconductor device as set forth in claim 1, wherein the dielectric constant of said etching stopper is larger than or equal to a summation of 2 and the dielectric constant of either one of the dielectric constants of said first and second dielectric films.

4. The semiconductor device as set forth in claim 2, wherein the dielectric constant of said etching stopper is larger than or equal to a summation of 2 and the dielectric constant of either one of the dielectric constants of said first and second dielectric films.

5. The semiconductor device as set forth in claim 1, wherein said metal interconnect includes copper as a constituting element.

* * * * *